United States Patent
Ohashi et al.

(10) Patent No.: US 12,329,034 B2
(45) Date of Patent: Jun. 10, 2025

(54) AUDIO DEVICE AND DRIVING METHOD THEREOF, AND DISPLAY DEVICE

(71) Applicant: Sony Group Corporation, Tokyo (JP)

(72) Inventors: Yoshio Ohashi, Kanagawa (JP); Shin Yamaguchi, Kanagawa (JP); Manabu Hamakawa, Tokyo (JP)

(73) Assignee: Sony Group Corporation (JP)

( * ) Notice: Subject to any disclaimer, the term of this patent is extended or adjusted under 35 U.S.C. 154(b) by 264 days.

(21) Appl. No.: 18/006,019

(22) PCT Filed: Jul. 14, 2021

(86) PCT No.: PCT/JP2021/026478
§ 371 (c)(1),
(2) Date: Jan. 19, 2023

(87) PCT Pub. No.: WO2022/024763
PCT Pub. Date: Feb. 3, 2022

(65) Prior Publication Data
US 2023/0354712 A1    Nov. 2, 2023

(30) Foreign Application Priority Data
Jul. 28, 2020   (JP) .................................. 2020-127050

(51) Int. Cl.
*H04R 25/00*    (2006.01)
*H04R 1/24*     (2006.01)
(Continued)

(52) U.S. Cl.
CPC .......... *H10N 30/2047* (2023.02); *H04R 1/24* (2013.01); *H04R 3/14* (2013.01); *H04R 17/00* (2013.01);
(Continued)

(58) Field of Classification Search
CPC . H04R 1/028; H04R 3/14; H04R 1/24; H04R 17/00; H04R 2217/01; H04R 5/00; H04R 1/227; H04R 1/403; H04R 2201/401; H04R 2440/05; H04R 2499/15; H04R 3/04; H04R 3/12; H04R 7/045; H04R 7/06
(Continued)

(56) References Cited

U.S. PATENT DOCUMENTS

2020/0233629 A1*  7/2020  Yeon .................... G10K 9/125

FOREIGN PATENT DOCUMENTS

| JP | 2001238285 A | 8/2001 |
| JP | 2006319626 A | 11/2006 |

(Continued)

OTHER PUBLICATIONS

International Search Report for Application No. PCT/JP2021/026478 mailed Oct. 5, 2021, pp. 1-3.

*Primary Examiner* — Phylesha Dabney
(74) *Attorney, Agent, or Firm* — Lerner David LLP

(57) ABSTRACT

The present technology relates to an audio device and a driving method thereof, and a display device which are configured to make it possible to obtain sufficient sound pressure level in a wider frequency band.
The audio device includes: a diaphragm; an electrodynamic vibrator that vibrates the diaphragm to output sound; and a piezoelectric vibrator that vibrates the diaphragm to output sound. The present technology can be applied to the display device.

8 Claims, 11 Drawing Sheets

(51) Int. Cl.
  *H04R 3/14* (2006.01)
  *H04R 17/00* (2006.01)
  *H10N 30/20* (2023.01)
  *H10N 30/50* (2023.01)
(52) U.S. Cl.
  CPC ......... *H10N 30/50* (2023.02); *H04R 2217/01* (2013.01)
(58) Field of Classification Search
  USPC .......................................................... 381/190
  See application file for complete search history.

(56) References Cited

FOREIGN PATENT DOCUMENTS

| | | | |
|---|---:|---|---|
| JP | 4317957 | B2 | 8/2009 |
| JP | 2013150305 | A | 8/2013 |
| JP | 6489291 | B2 | 3/2019 |
| JP | 2020109933 | A | 7/2020 |

* cited by examiner

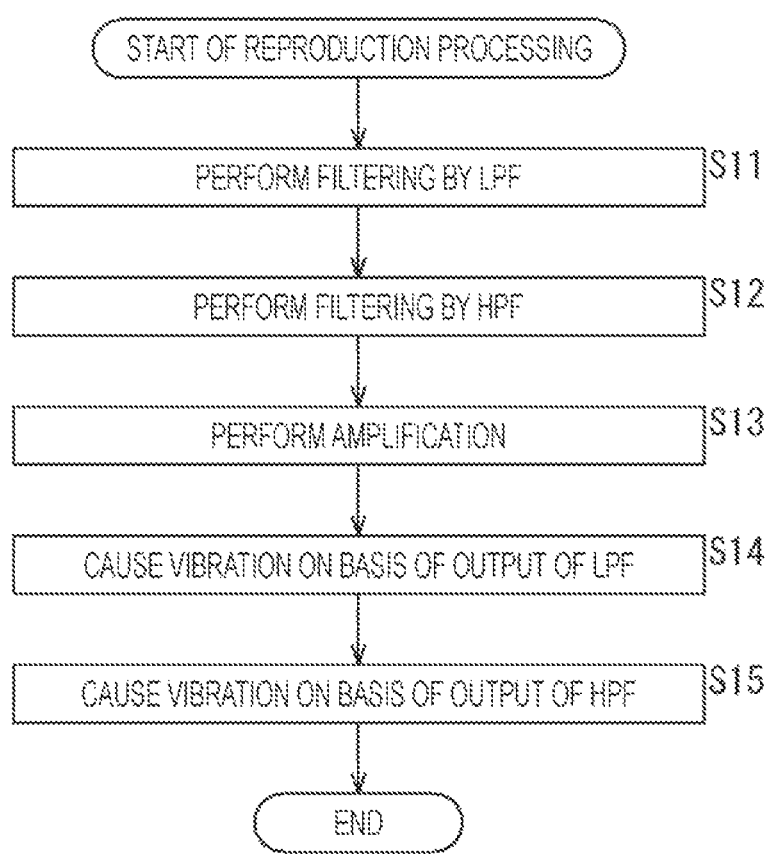

… (1)

AUDIO DEVICE AND DRIVING METHOD THEREOF, AND DISPLAY DEVICE

CROSS-REFERENCE TO RELATED APPLICATIONS

This application is a national phase entry under 35 U.S.C. § 371 of International Application No. PCT/JP2021/026478 filed Jul. 14, 2021, which claims the priority from Japanese Patent Application No. 2020-127050 filed in the Japanese Patent Office on Jul. 28, 2020, the entire contents of which are hereby incorporated by reference.

TECHNICAL FIELD

The present technology relates to an audio device and a driving method thereof, and a display device, and more particularly, to an audio device and a driving method thereof, and a display device which are configured to make it possible to obtain sufficient sound pressure level in a wider frequency band.

BACKGROUND ART

Conventionally, there is proposed a speaker system in which an exciter is arranged on a back surface of a television display to vibrate a display, and the display itself functions as a speaker diaphragm (see, for example, Patent Document 1 and Patent Document 2).

In such a speaker system, the display is vibrated by either an electrodynamic exciter or a piezoelectric exciter, and acoustic energy is radiated from a surface of the display.

CITATION LIST

Patent Document

Patent Document 1: Japanese Patent No. 6489291
Patent Document 2: Japanese Patent No. 4317957

SUMMARY OF THE INVENTION

Problems to be Solved by the Invention

In the above-described technology, however, it is difficult to obtain a sufficient sound pressure level in a wider frequency band.

For example, in the speaker system using the electrodynamic exciter, in a case where the diaphragm is heavy, the sound pressure level decreases at high frequencies so that it is difficult to obtain a sufficient sound volume.

Moreover, in a case where the area of the diaphragm is large, directivity is improved at high frequencies, that is, a directional angle becomes small, the sound pressure level in the high frequency band further decreases at a position laterally distant from the front of the speaker system, more specifically, the electrodynamic exciter.

Furthermore, in a case where the piezoelectric exciter is used, it is difficult to obtain a sufficient sound pressure level at low frequencies.

As described above, it is difficult to obtain a sufficient sound pressure level in a sound reproduction frequency band with a larger directional angle in the speaker system in which the exciter is arranged on the back surface of the television display and the acoustic energy is radiated from the surface of the display.

The present technology has been made in view of such a situation and aims to obtain a sufficient sound pressure level in a wider frequency band.

Solutions to Problems

An audio device according to a first aspect of the present technology includes: a diaphragm; an electrodynamic vibrator that vibrates the diaphragm to output sound; and a piezoelectric vibrator that vibrates the diaphragm to output sound.

A driving method according to a first aspect of the present technology is a driving method of an audio device, which includes a diaphragm, an electrodynamic vibrator, and a piezoelectric vibrator, and includes: vibrating, by the electrodynamic vibrator, the diaphragm to output sound; and vibrating, by the piezoelectric vibrator, the diaphragm to output sound.

According to the first aspect of the present technology, in the audio device including the diaphragm, the electrodynamic vibrator, and the piezoelectric vibrator, the electrodynamic vibrator vibrates the diaphragm to output sound, and the piezoelectric vibrator vibrates the diaphragm to output sound.

A display device according to a second aspect of the present technology includes: a plate-shaped display that displays an image; an electrodynamic vibrator that vibrates the display to output sound; and a piezoelectric vibrator that vibrates the display to output sound.

According to the second aspect of the present technology, in the display device including the plate-shaped display that displays an image, the electrodynamic vibrator, and the piezoelectric vibrator, the electrodynamic vibrator vibrates the display to output sound, and the piezoelectric vibrator vibrates the display to output sound.

BRIEF DESCRIPTION OF DRAWINGS

FIG. 12 is a flowchart for describing reproduction processing.

MODE FOR CARRYING OUT THE INVENTION

Hereinafter, embodiments to which the present technology is applied will be described with reference to the drawings.

First Embodiment

<Configuration Example of Appearance of Display Device>

The present technology is to vibrate a diaphragm using an electrodynamic exciter and a piezoelectric exciter to radiate acoustic energy, thereby making it possible to obtain a sufficient sound pressure level in a wider frequency band.

Note that an example in which the present technology is applied to a display device will be described hereinafter, but the present technology can be applied to any device having a sound reproduction function, such as an audio device that implements only a sound reproduction function without having a display function.

Figure 1:
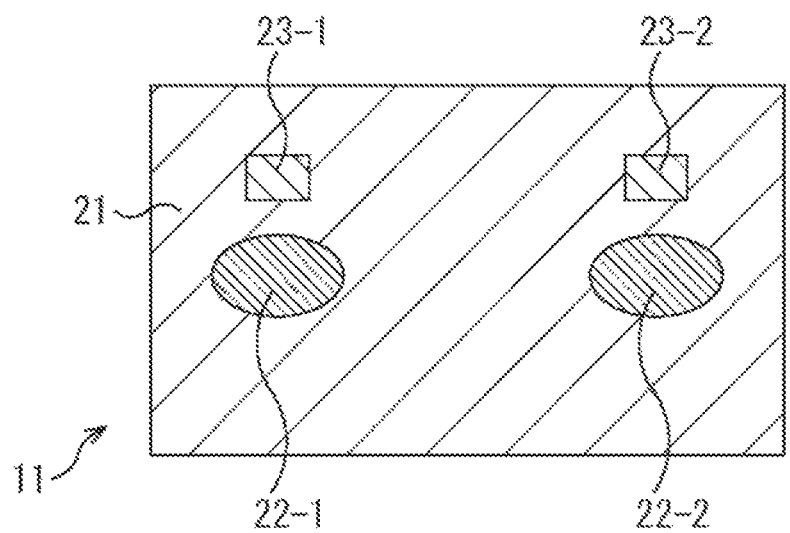
FIG. 1 is a diagram illustrating a configuration example of an appearance of a display device.

FIG. 1 is a diagram illustrating a configuration example of an appearance of a display device which is an example of a speaker system to which the present technology is applied.

A display device 11 includes a display 21, an electrodynamic exciter 22-1, an electrodynamic exciter 22-2, a piezoelectric exciter 23-1, and a piezoelectric exciter 23-2.

The display 21 includes a flat plate-shaped display panel that implements a display function, and displays an image on the basis of image data supplied from a display controller (not illustrated).

The electrodynamic exciter 22-1 and the electrodynamic exciter 22-2 are electrodynamic vibrators (vibrating devices) each including a voice coil, a magnet, and the like, and are fixed to a back surface of the display 21, that is, a surface opposite to a surface on which an image is displayed. FIG. 1 is a view of display device 11 as viewed from the back surface of the display 21.

The electrodynamic exciter 22-1 and the electrodynamic exciter 22-2 are driven according to an input acoustic signal to vibrate the display 21 and radiate acoustic energy (sound) from the display 21.

Note that the electrodynamic exciter 22-1 and the electrodynamic exciter 22-2 will also be simply referred to as an electrodynamic exciter 22 hereinafter in a case where it is not particularly necessary to distinguish them.

The piezoelectric exciter 23-1 and the piezoelectric exciter 23-2 are piezoelectric vibrators (vibrating devices) each including, for example, a piezoelectric element, and are fixed to the back surface of the display 21.

The piezoelectric exciter 23-1 and the piezoelectric exciter 23-2 are driven according to an input acoustic signal to vibrate the display 21 and radiate acoustic energy (sound) from the display 21.

Note that the piezoelectric exciter 23-1 and the piezoelectric exciter 23-2 will also be simply referred to as a piezoelectric exciter 23 hereinafter in a case where it is not particularly necessary to distinguish them.

In the display device 11, not only the display 21 implements the display function, but also the display 21, the electrodynamic exciter 22, and the piezoelectric exciter 23 function as an audio device (speaker system) that outputs sound based on an acoustic signal.

In this case, the electrodynamic exciter 22 and the piezoelectric exciter 23 vibrate the display 21 to cause the display 21 to function as a diaphragm of the audio device (speaker).

In a case where the electrodynamic exciter 22 is used as the vibrator, a sufficient sound pressure level and a wide (large) directional angle can be obtained particularly at low frequencies (a low frequency band).

On the other hand, in a case where the piezoelectric exciter 23 is used as the vibrator, a sufficient sound pressure level and a wide (large) directional angle can be obtained particularly at high frequencies (a high frequency band).

Therefore, a uniform and sufficient sound pressure level can be obtained in the entire frequency band as a sound reproduction target since the electrodynamic exciter 22 and the piezoelectric exciter 23 are used as the vibrators in combination in the display device 11.

Moreover, it is possible to achieve the audio device having a wide (large) directional angle in the entire frequency band as the sound reproduction target since the electrodynamic exciter 22 and the piezoelectric exciter 23 are used in combination.

That is, a user can listen to reproduced sound at a uniform and sufficient sound pressure level in the entire frequency band as the sound reproduction target not only in the front of the display device 11 but also at a position laterally shifted (distant) from the front.

Furthermore, in the display device 11, the piezoelectric exciter 23-1 is arranged in the vicinity of the electrodynamic exciter 22-1, and the piezoelectric exciter 23-2 is arranged in the vicinity of the electrodynamic exciter 22-2.

In particular, when the piezoelectric exciter 23 is arranged at a position of a vibration node of the electrodynamic exciter 22, it is possible to reduce Doppler distortion caused by being affected by vibration for low frequency band reproduction by the display 21 and to perform sound reproduction with a higher sound quality.

In the example of FIG. 1, stereo sound reproduction including an L channel and an R channel is performed by the display device 11.

Therefore, in the display 21, the electrodynamic exciter 22-1 and the piezoelectric exciter 23-1, and the electrodynamic exciter 22-2 and the piezoelectric exciter 23-2 are arranged symmetrically with respect to the center of the display 21.

Note that the example in which a pair of the electrodynamic exciters 22 and a pair of the piezoelectric exciters 23 are provided has been described here, but any number of the electrodynamic exciters 22 and any number of the piezoelectric exciters 23 may be provided.

For example, the electrodynamic exciter 22 and the piezoelectric exciter 23 may be provided for every channel of sound reproduction, or a plurality of the piezoelectric exciters 23 may be provided in the vicinity of one electrodynamic exciter 22.

Furthermore, the example in which the piezoelectric exciter 23 is provided on the upper side of the electrodynamic exciter 22 in the drawing has been described here, but an arrangement position of the piezoelectric exciter 23 is not limited thereto, and may be any position.

<Functional Configuration Example of Display Device>

Figure 2:
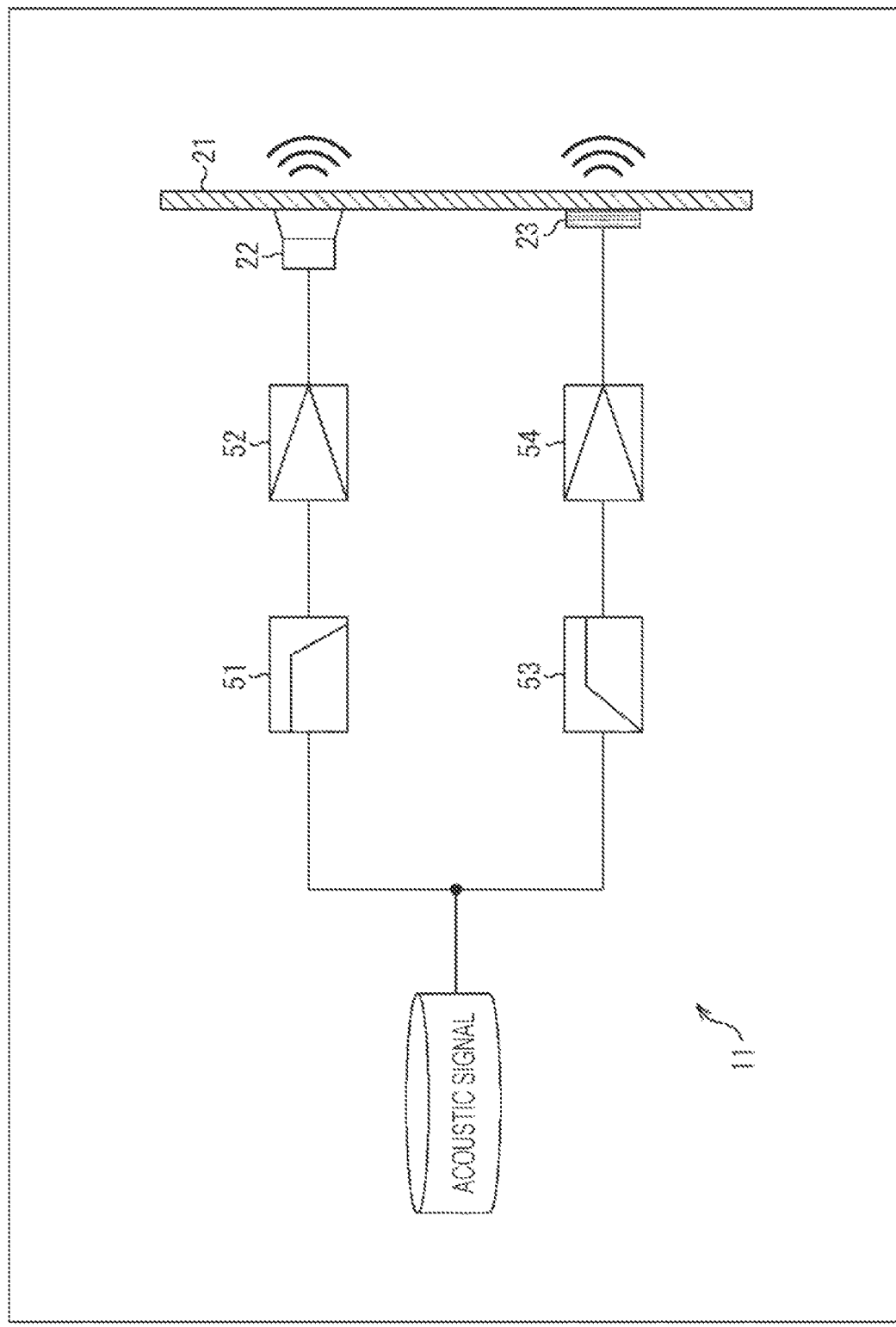
FIG. 2 is a diagram illustrating a functional configuration example of the display device.

FIG. 2 illustrates a functional configuration example of the display device 11.

Note that parts in FIG. 2 corresponding to those of the case in FIG. 1 will be denoted by the same reference signs, and the description thereof will be omitted as appropriate.

Furthermore, FIG. 2 illustrates only some functional blocks and portions configured to cause the display device 11 to function as the audio device. In particular, only the functional blocks related to one channel are illustrated in this example in order to simplify the description.

In the example illustrated in FIG. 2, the display device 11 includes a low pass filter (LPF) 51, an amplifier 52, the electrodynamic exciter 22, a high pass filter (HPF) 53, an amplifier 54, the piezoelectric exciter 23, and the display 21.

In this example, the LPF 51 and the HPF 53 are supplied with an acoustic signal of one identical channel such as the R channel or the L channel of the content, for example.

The LPF 51 filters the supplied acoustic signal to block a high frequency band component, and supplies, to the amplifier 52, a mid-low frequency band signal including a mid-frequency band component and a low frequency band component obtained as a result, that is, mid-low frequency band components.

The amplifier 52 amplifies the mid-low frequency band signal supplied from the LPF 51 and supplies the amplified mid-low frequency band signal to the electrodynamic exciter 22.

The electrodynamic exciter 22 is driven on the basis of the mid-low frequency band signal supplied from the amplifier 52 to vibrate the display 21, thereby outputting sound in a mid-low frequency band from the display 21.

The HPF 53 filters the supplied acoustic signal to block mid-low frequency band components, and supplies, to the amplifier 54, a high frequency band signal including only a high frequency band component obtained as a result.

The amplifier 54 amplifies the high frequency band signal supplied from the HPF 53 and supplies the amplified high frequency band signal to the piezoelectric exciter 23.

The piezoelectric exciter 23 is driven on the basis of the high frequency band signal supplied from the amplifier 54 to vibrate the display 21, thereby outputting sound in a high frequency band from the display 21.

For example, in a case where the LPF 51 generates a mid-low frequency band signal including a component of a predetermined frequency or lower, the HPF 53 generates a high frequency band signal including a component of a frequency of at least the above-described predetermined frequency or higher in a frequency band as a sound reproduction target. That is, sound at frequencies in the entire frequency band as the sound reproduction target is output by the vibration by the electrodynamic exciter 22 and the vibration by the piezoelectric exciter 23.

Furthermore, only the functional blocks related to one channel are illustrated here. More specifically, however, the display device 11 is provided with the LPF 51, the amplifier 52, the electrodynamic exciter 22, the HPF 53, the amplifier 54, and the piezoelectric exciter 23 described above for every channel.

Moreover, the example in which each of the amplifier 52 and the amplifier 54 is provided at the subsequent stage of each of the LPF 51 and the HPF 53 has been described here, but an amplifier may be provided at the preceding stage of each of the LPF 51 and the HPF 53. In such a case, for example, an output of one amplifier may be supplied to the LPF 51 and the HPF 53.

<Regarding Piezoelectric Exciter>

Next, the piezoelectric exciter 23 will be described.

Figure 3:
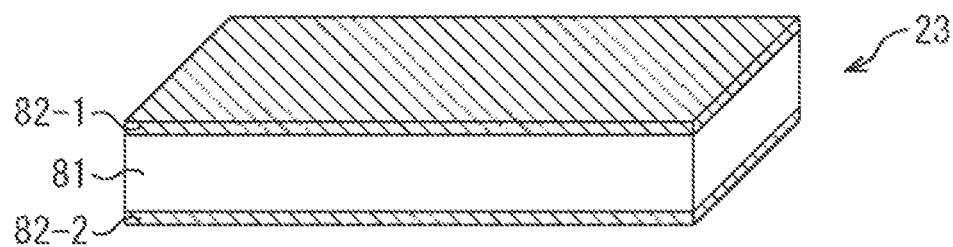
FIG. 3 is a diagram illustrating a configuration example of a piezoelectric exciter.

As illustrated in FIG. 3, for example, the piezoelectric exciter 23 includes a plate-shaped piezoelectric element 81 and electrodes 82-1 and 82-2 formed on upper and lower surfaces of the piezoelectric element 81 in the drawing. Note that the electrode 82-1 and the electrode 82-2 will also be simply referred to as an electrode 82 hereinafter in a case where it is not particularly necessary to distinguish them.

Here, a direction in which the electrodes constituting the piezoelectric exciter 23 are arrayed, that is, a direction perpendicular to a surface of the piezoelectric element constituting the piezoelectric exciter 23 on which the electrodes are provided is referred to as a thickness direction, and a direction perpendicular to the thickness direction is referred to as a length direction.

In the example of FIG. 3, the direction in which the electrodes 82-1 and 82-2 are arrayed, that is, an up-down direction in the drawing is the thickness direction, and a right-left direction and a depth direction in the drawing are the length direction.

In the piezoelectric exciter 23, when a voltage as an acoustic signal (high frequency band signal) is applied to the piezoelectric element 81 via the electrode 82, the piezoelectric element 81 expands and contracts in the length direction according to the applied voltage. Therefore, the plate-shaped display 21 to which the piezoelectric exciter 23 is fixed is bent to vibrate, and sound based on the input acoustic signal is output.

Note that the example in which the piezoelectric exciter 23 includes one piezoelectric element 81, that is, one layer of the piezoelectric element 81 has been described in FIG. 3, but the piezoelectric exciter 23 may include a plurality of piezoelectric elements stacked in multiple layers.

Figure 4:
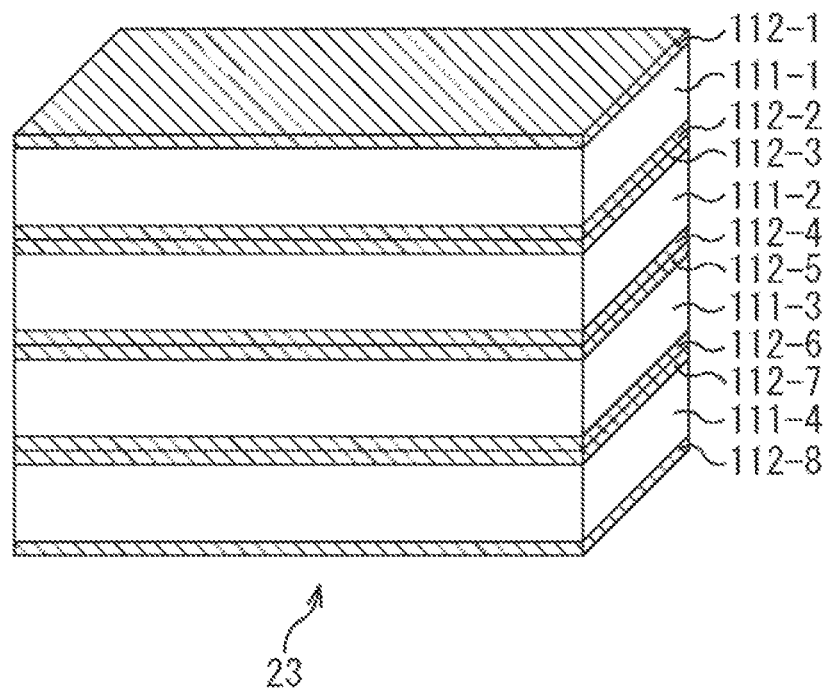
FIG. 4 is a diagram illustrating a configuration example of the piezoelectric exciter.

In such a case, the piezoelectric exciter 23 is configured, for example, as illustrated in FIG. 4.

In the example of FIG. 4, the piezoelectric exciter 23 includes piezoelectric elements 111-1 to 111-4, and electrodes 112-1 to 112-8.

In this example, the plate-shaped piezoelectric elements 111-1 to 111-4 corresponding to the piezoelectric element 81 illustrated in FIG. 3 are stacked in the up-down direction in the drawing, that is, in the thickness direction of the piezoelectric elements 111-1 to 111-4.

Note that the piezoelectric elements 111-1 to 111-4 will be simply referred to as piezoelectric elements 111 hereinafter in a case where it is not particularly necessary to distinguish them.

Furthermore, electrodes configured to apply a voltage as an acoustic signal (high frequency band signal) are respectively formed on surfaces facing each other in the thickness direction of each of the piezoelectric elements 111.

That is, the electrodes 112-1 and 112-2 are respectively formed on upper and lower surfaces of the piezoelectric element 111-1 in the drawing, and the electrodes 112-3 and 112-4 are respectively formed on upper and lower surfaces of the piezoelectric element 111-2.

Similarly, the electrodes 112-5 and 112-6 are respectively formed on upper and lower surfaces of the piezoelectric element 111-3 in the drawing, and the electrodes 112-7 and 112-8 are respectively formed on upper and lower surfaces of the piezoelectric element 111-4.

Note that the electrodes 112-1 to 112-8 will also be simply referred to as electrodes 112 hereinafter in a case where it is not necessary to particularly distinguish them.

In the example illustrated in FIG. 4, the piezoelectric exciter 23 has a stacked structure obtained by arraying the four piezoelectric elements 111 in the thickness direction of the piezoelectric elements 111.

In this example as well, each of the piezoelectric elements 111 expands and contracts in the length direction when a voltage as the same acoustic signal (high frequency band signal) is applied to each of the piezoelectric elements 111 via the electrode 112.

Here, the piezoelectric elements 111 are stacked, for example, such that the same electric field is applied to a polarization direction of each of the piezoelectric elements 111 for all the four piezoelectric elements 111 constituting the piezoelectric exciter 23, that is, such that all the piezoelectric elements 111 are deformed (expand and contract) in the same direction when the voltage is applied.

Therefore, a larger expansion/contraction force can be obtained in the piezoelectric exciter 23 having the stacked configuration illustrated in FIG. 4 as compared with the example illustrated in FIG. 3.

Figure 5:
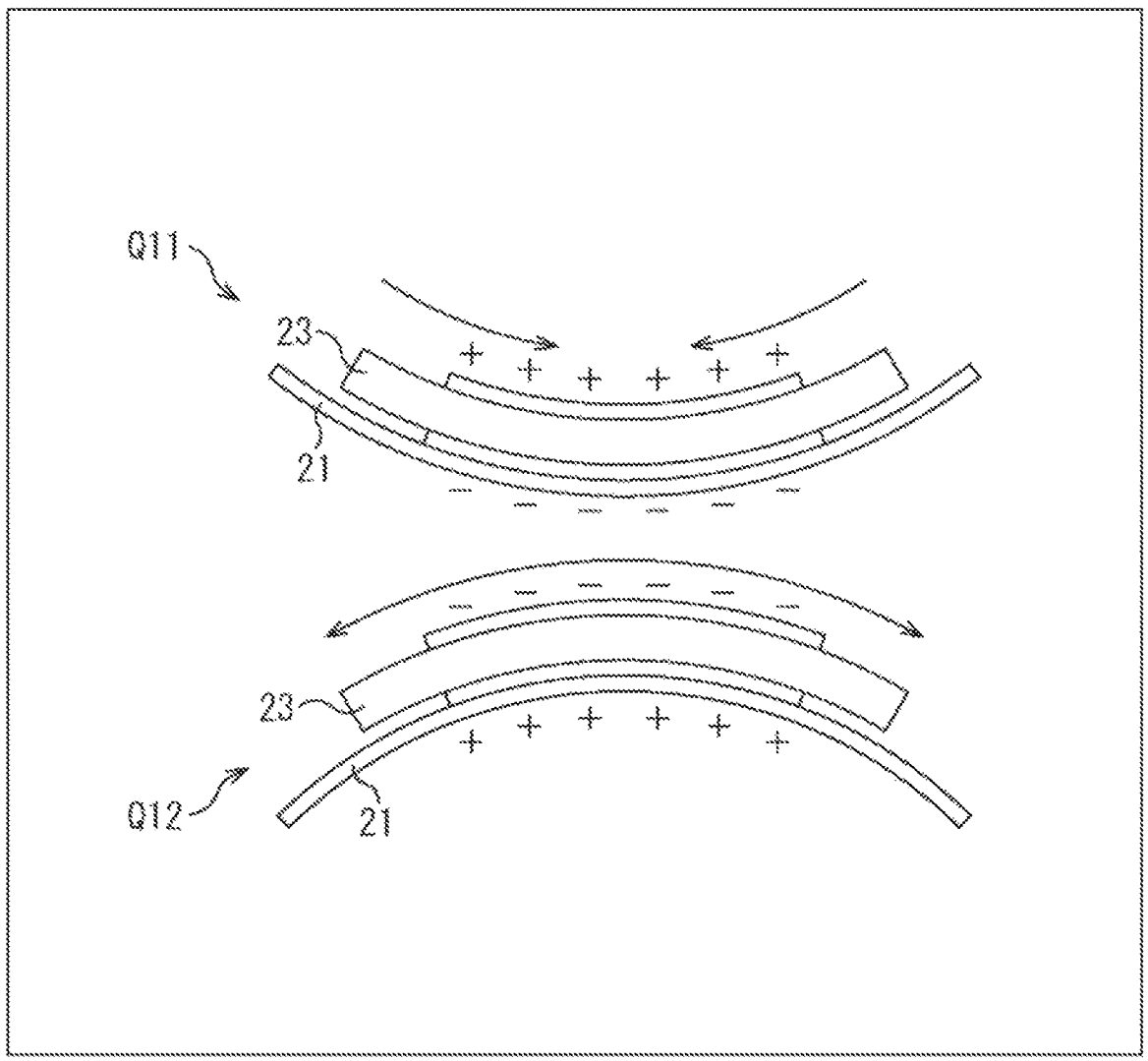
FIG. 5 is a diagram for describing an operation of the piezoelectric exciter.

Here, an operation example of the piezoelectric exciter 23 will be described with reference to FIG. 5. Note that it is assumed that the piezoelectric exciter 23 has the configuration illustrated in FIG. 3 in order to simplify the description.

For example, it is assumed that the electrode 82-2 is provided on the display 21 side of the piezoelectric exciter 23 and the electrode 82-1 is provided on a side opposite to the display 21 side of the piezoelectric exciter 23. Note that the illustration of the electrode 82 is omitted here.

In such a case, the piezoelectric exciter 23 contracts (shrinks) when a voltage is applied to the piezoelectric exciter 23 such that the display 21 side, that is, the electrode 82-2 becomes negative and the electrode 82-1 on the opposite side becomes positive, for example, as indicated by an arrow Q11.

On the other hand, the piezoelectric exciter 23 expands outward when a voltage is applied to the piezoelectric exciter 23 such that the display 21 side, that is, the electrode 82-2 side becomes positive and the electrode 82-1 on the opposite side becomes negative, for example, as indicated by an arrow Q12.

For example, with the piezoelectric exciter 23 having the configuration (structure) illustrated in FIG. 3 or 4 alone, only a surface of the piezoelectric exciter 23 on which the electrode 82 is provided expands and contracts even if a voltage is applied to the piezoelectric exciter 23, and no sound wave is radiated in a direction perpendicular to the surface.

Therefore, in the display device 11, the piezoelectric exciter 23 is fixed to the display 21 by bonding or the like to form a monomorph structure such that excitation can be performed.

Specifically, when a voltage is applied to the piezoelectric exciter 23 in a state where the piezoelectric exciter 23 is fixed to the display 21, the piezoelectric exciter 23 expands and contracts as indicated by the arrow Q11 and the arrow Q12, whereby the display 21 bends.

Since the display 21 is bent by the piezoelectric exciter 23 according to an acoustic signal in this manner, the display 21 vibrates, and as a result, a sound wave (acoustic energy) based on the acoustic signal is radiated from the surface of the display 21.

Since the audio device having the monomorph structure is configured by the piezoelectric exciter 23 and the display 21 in the display device 11 as described above, the display 21 can be bent to vibrate by applying a voltage to the piezoelectric exciter 23, and a sound wave can be output.

Note that the example has been described in which the same electric field is applied to the polarization direction of each of the piezoelectric elements 111 in a case where the piezoelectric exciter 23 has the stacked structure as illustrated in FIG. 4, but different electric fields may be applied to the polarization directions of the respective piezoelectric elements 111.

That is, some of the plurality of piezoelectric elements 111 constituting the piezoelectric exciter 23, such as the piezoelectric elements 111 provided adjacent to each other, may be deformed in directions different from each other in a case where a voltage is applied.

In such a case, the piezoelectric exciter 23 has, for example, a bimorph structure in which a voltage is applied such that different electric fields are applied to polarization directions in some piezoelectric elements 111. As a specific example of the bimorph structure, for example, the piezoelectric element 111-1 and the piezoelectric element 111-2 provided on the upper half in FIG. 4 have a structure expanding in the length direction (outward) from a relationship between a polarization direction and an electric field direction. On the other hand, for example, in FIG. 4, the piezoelectric element 111-3 and the piezoelectric element 111-4 provided on the lower half have a structure contracting in the length direction from the relationship between the polarization direction and the electric field direction. In this case, for example, an electric field is applied in the same direction as the polarization direction in the piezoelectric elements 111 in the upper half of the piezoelectric exciter 23, and an electric field is applied in a direction opposite to the polarization direction in the piezoelectric elements 111 in the lower half. Note that a structure (bimorph structure) in which the piezoelectric element 111 in the upper half of the piezoelectric exciter 23 contracts in the length direction and the piezoelectric element 111 in the lower half expands in the length direction may be adopted.

In the piezoelectric exciter 23 having such a bimorph structure, when a certain piezoelectric element 111 performs a contracting movement, the other piezoelectric element 111 performs an expanding movement, and thus, not only the display 21 but also the piezoelectric exciter 23 itself is bent to vibrate.

It is only required to select whether the piezoelectric exciter 23 has the bimorph structure or the structure (configuration) in which the respective piezoelectric elements 111 are similarly deformed as described with reference to FIG. 4 as necessary.

<Regarding Attachment of Piezoelectric Exciter>

Next, examples of a method of attaching, that is, a method of fixing the piezoelectric exciter 23 to the display 21 will be described with reference to FIGS. 6 to 9.

Note that parts in FIGS. 6 to 9 corresponding to those of the case in FIG. 1 will be denoted by the same reference signs, and the description thereof will be omitted as appropriate. Furthermore, parts corresponding to each other in FIGS. 6 to 9 will also be denoted by the same reference signs, and the description thereof will be omitted as appropriate.

Figure 6:
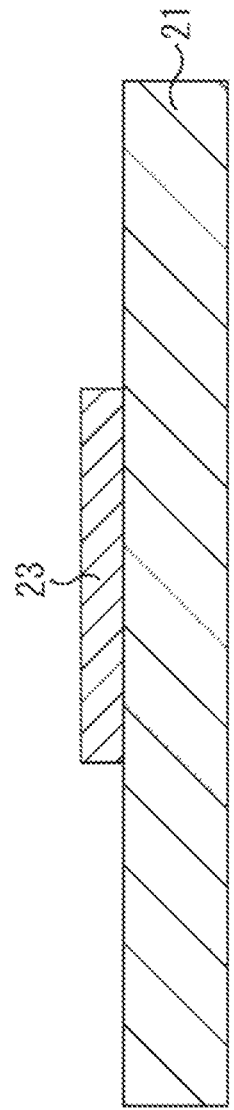
FIG. 6 is a diagram illustrating an example of a method of attaching the piezoelectric exciter.

For example, as illustrated in FIG. 6, the piezoelectric exciter 23 may be directly bonded and fixed (adhesively fixed) to the back surface of the display 21 with an adhesive or the like.

At this time, for example, the plate-shaped display 21 functioning as the diaphragm is preferably configured to be thin and hard as much as possible.

In particular, a material forming the display 21 is preferably formed to be as close as possible to a material of the piezoelectric exciter 23 such that the strength of the display 21 serving as the diaphragm is close to the strength of the piezoelectric exciter 23 serving as the vibrating machine. In this manner, the display 21 is more easily bent, and higher sound reproduction performance can be obtained.

Figure 7:
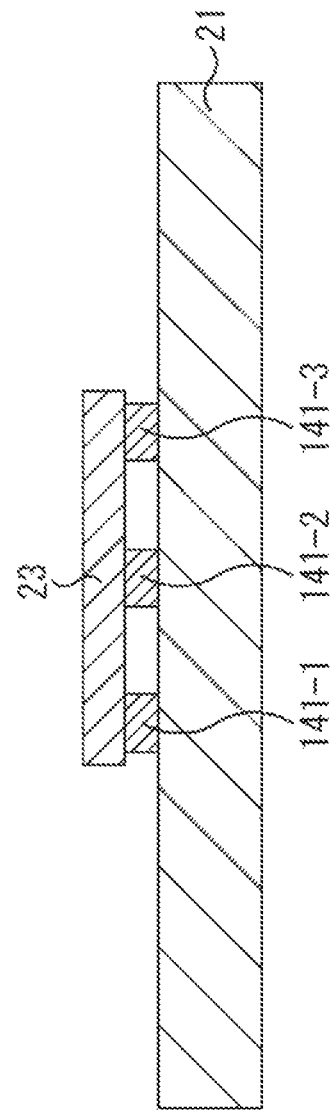
FIG. 7 is a diagram illustrating an example of the method of attaching the piezoelectric exciter.

Furthermore, in the example illustrated in FIG. 7, the piezoelectric exciter 23 is adhesively fixed to the back surface of the display 21 by a plurality of double-sided tapes 141-1 to 141-3.

In particular, the piezoelectric exciter 23 and the display 21 adhere to each other at three locations of the double-sided tapes 141-1 to 141-3 in this example, and a gap is provided between the piezoelectric exciter 23 and the display 21 at the other locations. That is, the piezoelectric exciter 23 is adhesively fixed to the display 21 in a floating state.

Thus, the display 21 is bent to vibrate when being vibrated by the piezoelectric exciter 23.

Note that the double-sided tape 141-1 to the double-sided tape 141-3 will also be simply referred to as double-sided tapes 141 hereinafter in a case where it is not particularly necessary to distinguish them.

Furthermore, in FIG. 7, the double-sided tapes 141 are drawn to be thick in the up-down direction in the drawing in order to facilitate visibility of the drawing, but the double-sided tape 141 actually has a thickness of about 0.1 mm or the like.

In this example as well, the display 21 is preferably configured to thin and hard as much as possible similarly to the example illustrated in FIG. 6. Furthermore, a material forming the display 21 may be formed as close as possible to a material of the piezoelectric exciter 23.

Furthermore, the example in which the piezoelectric exciter 23 and the display 21 are adhesively fixed at the three locations by the double-sided tapes 141 has been described here, but the piezoelectric exciter 23 and the display 21 may be adhesively fixed at any location as long as the number of locations is three or more.

Figure 8:
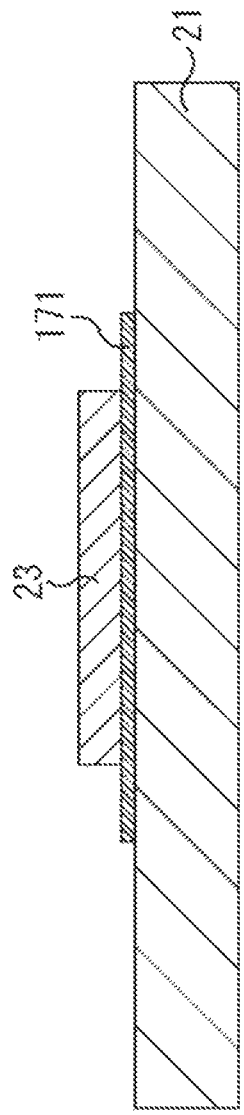
FIG. 8 is a diagram illustrating an example of the method of attaching the piezoelectric exciter.

In the example illustrated in FIG. 8, the piezoelectric exciter 23 is bonded and fixed to the back surface of the display 21 via a thin plate-shaped shim plate 171 (flat plate).

That is, the shim plate 171 is adhesively fixed to the back surface of the display 21, and the piezoelectric exciter 23 is further adhesively fixed to the shim plate 171.

Thus, when the piezoelectric exciter 23 is driven, the display 21 is vibrated via the shim plate 171, whereby the display 21 is bent to vibrate.

Note that the display 21 and the shim plate 171 are preferably configured to be thin and hard as much as possible. Furthermore, a material forming the display 21 or the shim plate 171 may be formed as close as possible to a material of the piezoelectric exciter 23.

A ceramic piezoelectric element constituting the piezoelectric exciter 23 is easily cracked, and care is required for handling, but the shim plate 171 provided between the display 21 and the piezoelectric exciter 23 suppress the piezoelectric element from being cracked and facilitates handling.

Figure 9:
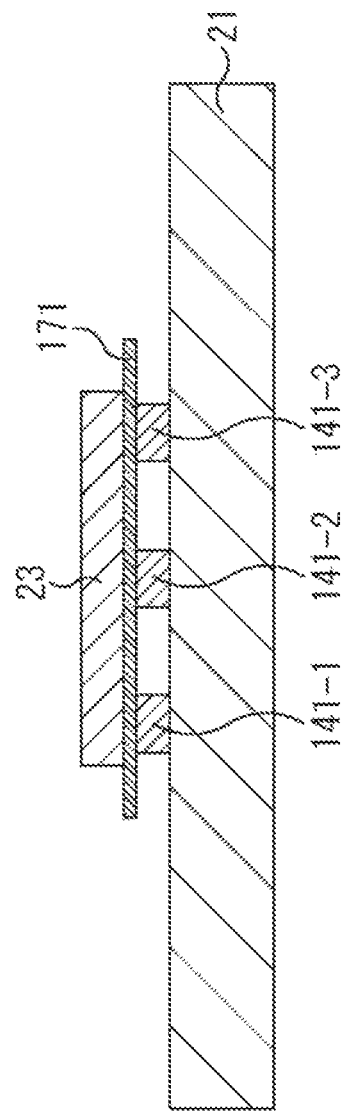
FIG. 9 is a diagram illustrating an example of the method of attaching the piezoelectric exciter.

Moreover, in the example illustrated in FIG. 9, the shim plate 171 is adhesively fixed to the piezoelectric exciter 23, and the shim plate 171 is adhesively fixed to the back surface of the display 21 by the plurality of double-sided tapes 141-1 to 141-3.

In this example, the shim plate 171 and the display 21 adhere to each other by the double-sided tapes 141 at the three locations, and a floating state is formed at the other locations due to a gap provided between the shim plate 171 and the display 21.

Thus, the display 21 is bent to vibrate when being vibrated by the piezoelectric exciter 23.

Note that, in this example as well, the display 21 and the shim plate 171 are preferably configured to be thin and hard as much as possible similarly to the above example. Furthermore, a material forming the display 21 or the shim plate 171 may be formed as close as possible to a material of the piezoelectric exciter 23.

In addition, the number of adhesion locations between the shim plate 171 and the display 21 via the double-sided tapes 141 may be any number as long as at least three or more locations are provided.

When the piezoelectric exciter 23 is fixed to the display 21 as illustrated in FIGS. 6 to 9 described above, the monomorph structure can configured by the piezoelectric exciter 23 and the display 21 so that the display 21 can be bent to vibrate.

Note that the example in which the display 21 having the display function is also caused to function as the diaphragm is described here, but the diaphragm does not necessarily have the display function.

For example, a plate-shaped shim plate may be used as a diaphragm, and the electrodynamic exciter 22 and the piezoelectric exciter 23 may be attached to the diaphragm to achieve an audio device having only a sound reproduction function. In such a case, it is only required to attach the piezoelectric exciter 23 to the shim plate serving as the diaphragm, for example, as illustrated in FIGS. 6 to 9.

<Regarding Frequency Characteristics and Directional Characteristics>

Next, frequency characteristics and directional characteristics of the display device 11 will be described.

Figure 10:
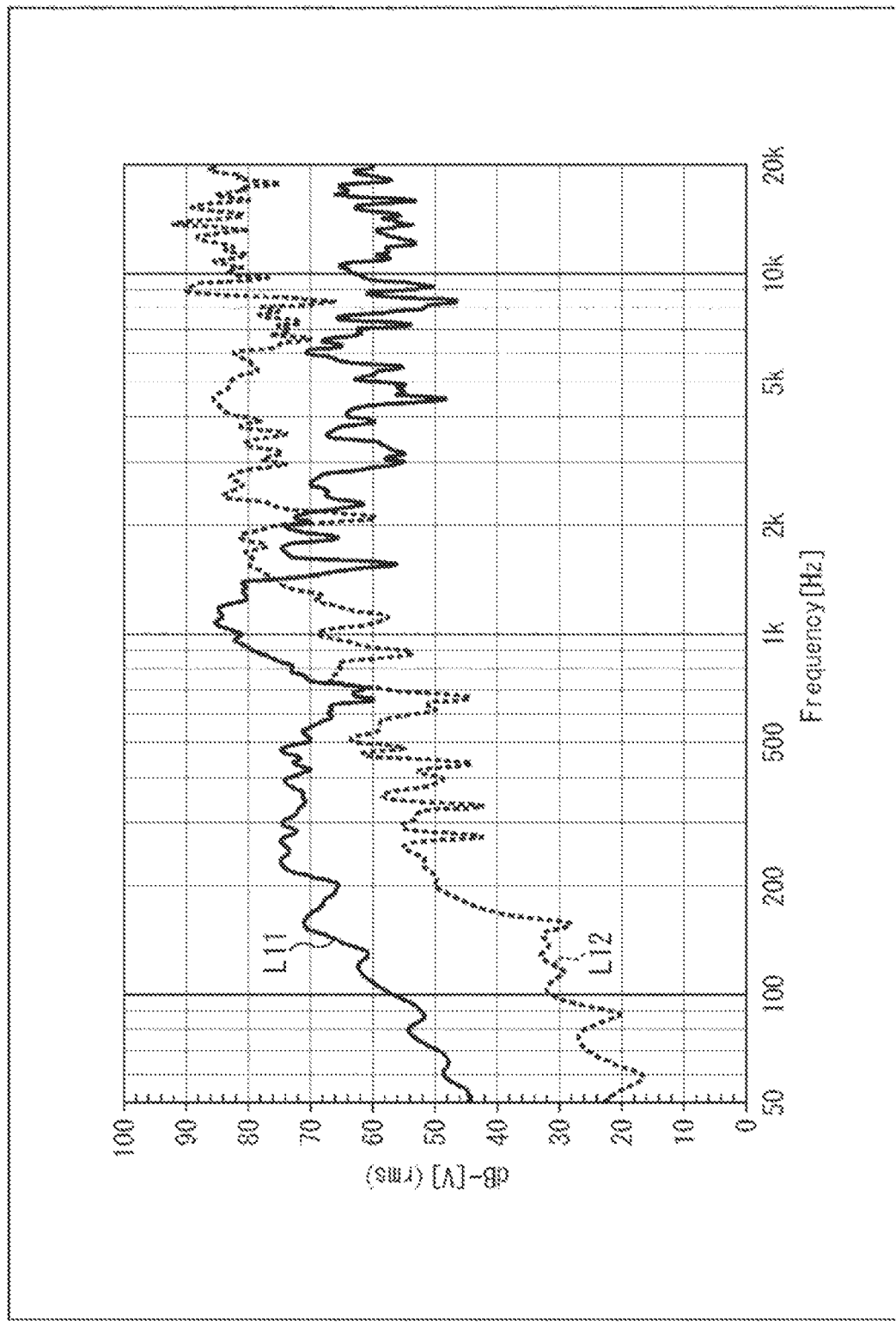
FIG. 10 is a diagram for describing frequency characteristics of the display device.

FIG. 10 is a diagram illustrating the frequency characteristics of the display device 11. Note that, in FIG. 10, the vertical axis represents a sound pressure level, and the horizontal axis represents a frequency.

In FIG. 10, a polygonal line L11 indicates a frequency characteristic of the electrodynamic exciter 22, and a polygonal line L12 indicates a frequency characteristic of the piezoelectric exciter 23.

For example, in the electrodynamic exciter 22, it can be seen that a sound pressure level in a mid-low frequency band is high, and a sound pressure level in a high frequency band is lower than that in the mid-low frequency band.

Conversely, in the piezoelectric exciter 23, it can be seen that a sound pressure level in the high frequency band is high, and a sound pressure level in the mid-low frequency band is lower than that in the high frequency band.

Furthermore, when comparing the electrodynamic exciter 22 and the piezoelectric exciter 23, it can be seen that the sound pressure level of the electrodynamic exciter 22 is higher in the mid-low frequency band, and the sound pressure level of the piezoelectric exciter 23 is higher in the high frequency band.

Therefore, it is possible to obtain a sufficient sound pressure level in a wider frequency band, that is, in the entire frequency band as the sound reproduction target by using the electrodynamic exciter 22 and the piezoelectric exciter 23 in combination.

Figure 11:
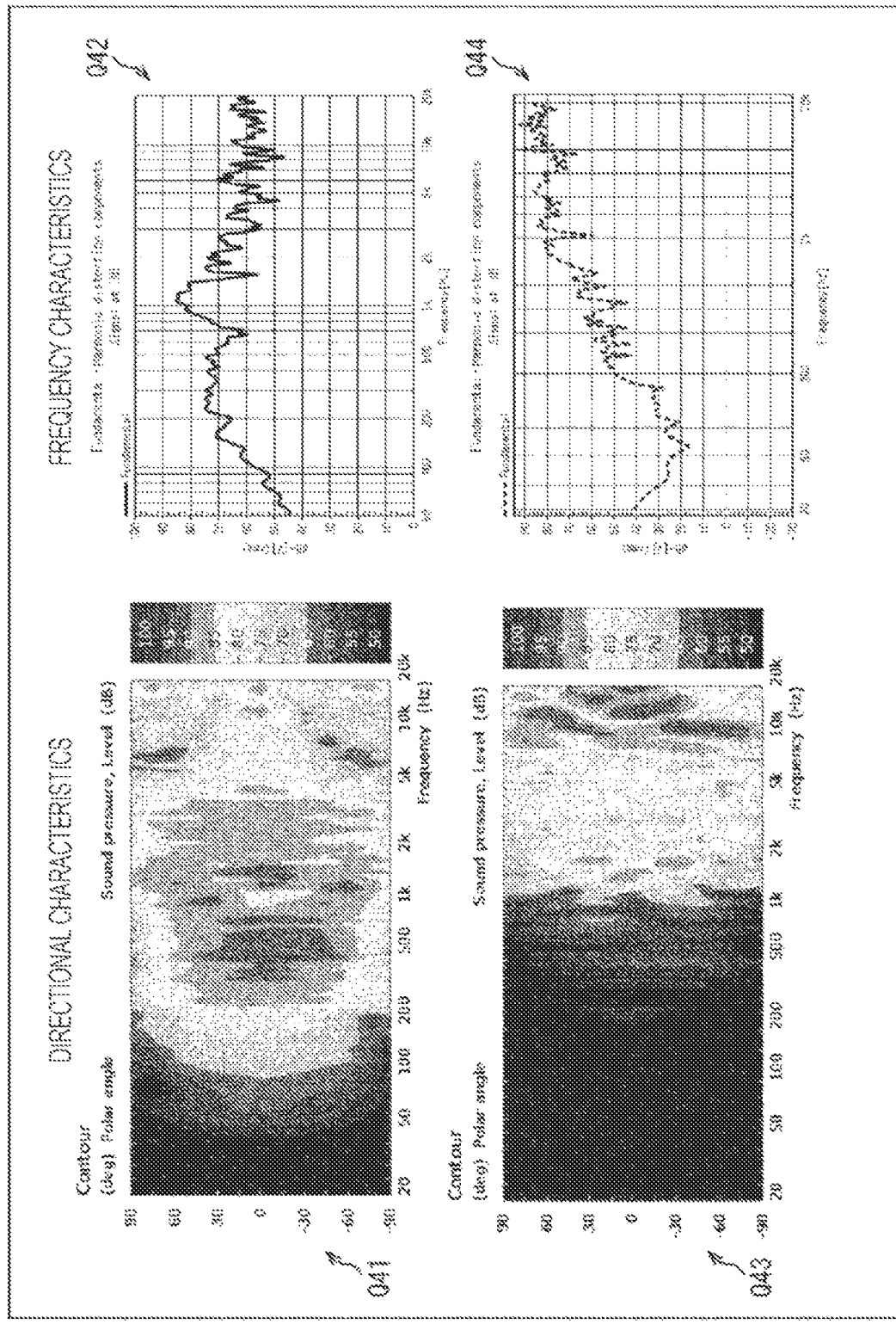
FIG. 11 is a diagram for describing frequency characteristics and directional characteristics of the display device.

Furthermore, FIG. 11 is a diagram illustrating measurement results of directional characteristics and the frequency characteristics of the electrodynamic exciter 22 and the piezoelectric exciter 23.

Here, the directional characteristic (contour diagram) of the electrodynamic exciter 22 is illustrated in a portion indicated by an arrow Q41, and the frequency characteristic of the electrodynamic exciter 22 is illustrated in a portion indicated by an arrow Q42. Similarly, the directional characteristic (contour diagram) of the piezoelectric exciter 23 is illustrated in a portion indicated by an arrow Q43, and the frequency characteristic of the piezoelectric exciter 23 is illustrated in a portion indicated by an arrow Q44.

In the portion indicated by the arrow Q41 and the portion indicated by the arrow Q43, the vertical axis represents an angle in the right-left direction from the center of the display 21, the horizontal axis represents a frequency, and gradations (colors) in the drawing represent sound pressure levels.

For example, in the electrodynamic exciter 22, it can be seen that a contour color is uniform at a wide angle and wide directivity, that is, a large directional angle is obtained in the mid-low frequency band, whereas a range in which a contour color is uniform is narrow and a directional angle is small in the high frequency band. In particular, in the electrodynamic exciter 22, it can be seen that the sound pressure level decreases as the angle from the center increases in the high frequency band.

On the other hand, in the piezoelectric exciter 23, it can be seen that a contour color is uniform in a wide angle range and wide directivity, that is, a large directional angle is obtained in the high frequency band.

Furthermore, in the portion indicated by the arrow Q42 and the portion indicated by the arrow Q44, the vertical axis represents a sound pressure level and the horizontal axis represents a frequency. In particular, in the portion indicated by the arrow Q42 and the portion indicated by the arrow Q44, frequency characteristics in the vicinity of the electrodynamic exciter 22 and the piezoelectric exciter 23 are illustrated, and it can be seen that the characteristics similar to those in the case of FIG. 10 are obtained.

The piezoelectric exciter 23 has a larger vibrating force than the electrodynamic exciter 22, and thus, can vibrate the entire diaphragm even if the diaphragm is somewhat hard.

Therefore, a wide region of the diaphragm (display 21), that is, the entire diaphragm (entire surface) can be bent to vibrate even at high frequencies, and the directional angle can be made larger. That is, a sufficiently high sound pressure level can be obtained in a wider angular range.

As described above, since the piezoelectric exciter 23 and the electrodynamic exciter 22 are used to cause the display 21 to vibrate and output sound according to the display device 11, a sufficient sound pressure level can be obtained in a wider frequency band.

That is, in the display device 11, the electrodynamic exciter 22 having the high sound pressure level and the large directional angle in the mid-low frequency band and the piezoelectric exciter 23 having the high sound pressure level and the large directional angle in the high frequency band are operated in the respective frequency bands with good characteristics, so that it is possible to obtain a sufficiently high sound pressure level and a sufficiently large directional angle in the entire frequency band as the sound reproduction target.

Therefore, the user can watch and listen to a content with the same volume and the same sound quality not only directly in the front of the display device 11 but also at a position laterally distant from the direct front.

In particular, in the display device 11, sound can be radiated from a display screen by causing the display 21 itself to function as the diaphragm, and content reproduction with a more immersive feeling can be implemented. For example, a display object on the display screen can be made to coincide with a sound image localization position of sound radiated from the display object.

<Description of Reproduction Processing>

Here, an operation of the display device 11 described above will be described.

The display device 11 starts reproduction processing when reproduction of a content is instructed and an acoustic signal of the content is supplied. Hereinafter, the reproduction processing performed by the display device 11 will be described with reference to a flowchart of FIG. 12.

In step S11, the LPF 51 performs filtering by the LPF on the supplied acoustic signal, and supplies a mid-low frequency band signal obtained as a result to the amplifier 52.

In step S12, the HPF 53 performs filtering by the HPF on the supplied acoustic signal, and supplies a high frequency band signal obtained as a result to the amplifier 54.

In step S13, the amplifier 52 and the amplifier 54 amplify the mid-low frequency band signal supplied from the LPF 51 and the high frequency band signal supplied from the HPF 53, and supply the amplified signals to the electrodynamic exciter 22 and the piezoelectric exciter 23, respectively.

In step S14, the electrodynamic exciter 22 is driven on the basis of the output of the LPF 51, that is, the mid-low frequency band signal supplied from the LPF 51 via the amplifier 52, and causes the display 21 to vibrate. Therefore, sound of the content in the mid-to-low frequency band is output from the display 21.

In step S15, the piezoelectric exciter 23 is driven on the basis of the output of the HPF 53, that is, the high frequency band signal supplied from the HPF 53 via the amplifier 54, and causes the display 21 to vibrate. Therefore, sound of the content in the high frequency band is output from the display 21.

Note that processes in steps S14 and S15 are performed simultaneously. When the display 21 is vibrated by the piezoelectric exciter 23 and the electrodynamic exciter 22 and the sound of the content is output from the display 21 in this manner, the reproduction processing ends.

At this time, in a case where the content as a reproduction target is a video content, the display 21 also displays an image of the content.

As described above, the display device 11 drives the piezoelectric exciter 23 and the electrodynamic exciter 22 in combination to reproduce the sound of the content. Thus, a sufficient sound pressure level can be obtained in a wider frequency band.

Note that embodiments of the present technology are not limited to the above-described embodiment, and various modifications can be made within a scope not departing from a gist of the present technology.

Moreover, the present technology can also be configured as follows.

(1)

An audio device including:

a diaphragm;

an electrodynamic vibrator that vibrates the diaphragm to output sound; and a piezoelectric vibrator that vibrates the diaphragm to output sound.

(2)

The audio device according to (1), in which the diaphragm and the piezoelectric vibrator form a monomorph structure, and the piezoelectric vibrator bends the diaphragm to vibrate.

(3)

The audio device according to (1) or (2), in which the piezoelectric vibrator includes one piezoelectric element.

(4)

The audio device according to (1) or (2), in which the piezoelectric vibrator includes a plurality of stacked piezoelectric elements.

(5)

The audio device according to (4), in which a plurality of the piezoelectric elements forming the piezoelectric vibrator is stacked such that the plurality of the piezoelectric elements deforms in a same direction in a case where a voltage is applied.

(6)
The audio device according to (4), in which
some of a plurality of the piezoelectric elements forming the piezoelectric vibrator are deformed in directions different from each other in a case where a voltage is applied.
(7)
The audio device according to any one of (1) to (6), further including:
an LPF that performs filtering to block a high frequency band component on an acoustic signal; and
an HPF that performs filtering to block a low frequency band component on the acoustic signal,
in which the electrodynamic vibrator vibrates the diaphragm on the basis of a signal obtained by the LPF, and
the piezoelectric vibrator vibrates the diaphragm on the basis of a signal obtained by the HPF.
(8)
The audio device according to (7), in which
the electrodynamic vibrator and the piezoelectric vibrator are provided for every channel of the acoustic signal.
(9)
The audio device according to any one of (1) to (8), in which
the diaphragm is a display.
(10)
A driving method of an audio device, which includes a diaphragm, an electrodynamic vibrator, and a piezoelectric vibrator, the driving method including:
vibrating, by the electrodynamic vibrator, the diaphragm to output sound; and
vibrating, by the piezoelectric vibrator, the diaphragm to output sound.
(11)
A display device including:
a plate-shaped display that displays an image;
an electrodynamic vibrator that vibrates the display to output sound; and
a piezoelectric vibrator that vibrates the display to output sound.

REFERENCE SIGNS LIST

11 Display device
21 Display
22-1, 22-2, 22 Electrodynamic exciter
23-1, 23-2, 23 Piezoelectric exciter
51 LPF
52 Amplifier
53 HPF
54 Amplifier

The invention claimed is:
1. An audio device comprising:
a diaphragm;
an electrodynamic vibrator that vibrates the diaphragm to output sound;
a piezoelectric vibrator that vibrates the diaphragm to output sound;
an LPF that performs filtering to block a high frequency band component on an acoustic signal; and
an HPF that performs filtering to block a low frequency band component on the acoustic signal,
wherein the electrodynamic vibrator vibrates the diaphragm on a basis of a signal obtained by the LPF, and
the piezoelectric vibrator vibrates the diaphragm on a basis of a signal obtained by the HPF.
2. The audio device according to claim 1, wherein
the diaphragm and the piezoelectric vibrator form a monomorph structure, and
the piezoelectric vibrator bends the diaphragm to vibrate.
3. The audio device according to claim 1, wherein
the piezoelectric vibrator includes one piezoelectric element.
4. The audio device according to claim 1, wherein
the piezoelectric vibrator includes a plurality of stacked piezoelectric elements.
5. The audio device according to claim 4, wherein
a plurality of the piezoelectric elements forming the piezoelectric vibrator is stacked such that the plurality of the piezoelectric elements deforms in a same direction in a case where a voltage is applied.
6. The audio device according to claim 4, wherein
some of a plurality of the piezoelectric elements forming the piezoelectric vibrator are deformed in directions different from each other in a case where a voltage is applied.
7. The audio device according to claim 1, wherein
the electrodynamic vibrator and the piezoelectric vibrator are provided for every channel of the acoustic signal.
8. The audio device according to claim 1, wherein
the diaphragm is a display.

* * * * *